United States Patent
Gao et al.

(10) Patent No.: US 12,237,298 B1
(45) Date of Patent: Feb. 25, 2025

(54) COOPERATIVE BONDING METHOD FOR A BONDING HEAD OF A WIRE BONDING MACHINE AND A WIRE BONDING MACHINE

(71) Applicant: GUANGDONG UNIVERSITY OF TECHNOLOGY, Guangzhou (CN)

(72) Inventors: Jian Gao, Guangzhou (CN); Guocong Chen, Guangzhou (CN); Lanyu Zhang, Guangzhou (CN); Haixiang Deng, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 18/914,153

(22) Filed: Oct. 12, 2024

(30) Foreign Application Priority Data

Oct. 30, 2023 (CN) .......................... 202311416198.7

(51) Int. Cl.
*H01L 23/00* (2006.01)
*G05B 19/4155* (2006.01)

(52) U.S. Cl.
CPC .......... *H01L 24/78* (2013.01); *G05B 19/4155* (2013.01); *H01L 2224/78901* (2013.01)

(58) Field of Classification Search
None
See application file for complete search history.

(56) References Cited

U.S. PATENT DOCUMENTS 2,928,931 A 3/1960 Hoopes et al.

FOREIGN PATENT DOCUMENTS

| CN | 2684382 Y | 3/2005 |
|---|---|---|
| CN | 1672855 A | 9/2005 |
| CN | 101388352 A | 3/2009 |
| CN | 207205488 U | 4/2018 |
| CN | 207840506 U | 9/2018 |

(Continued)

OTHER PUBLICATIONS

L. Zhang, J. Gao, Y. Chen, X. Chen and Y. He, "A High-Efficiency Searching Time Reduction Method for VCM Soft-Landing Operation During Chip Bonding," in IEEE Transactions on Industrial Electronics, vol. 70, No. 9, pp. 9215-9226, Sep. 2023. (Year: 2023).*

(Continued)

*Primary Examiner* — Ryan A Jarrett

(57) ABSTRACT

A cooperative bonding method for a bonding head of a wire bonding machine, including setting an initial height value of the vertical lifting mechanism to be a difference value; upon receiving a bonding instruction, controlling the bonding head to perform an positioning operation on the target processing chip, controlling the vertical lifting mechanism to descend a preset distance; during the positioning operation of the bonding head on the target processing chip, when the acceleration motion and the overshoot is completed, controlling the vertical lifting mechanism to rise back; and during the rise back process, the pad of the chip does not exceed a residual vibration curve of the bonding head. This achieves the technical effect of improving the bonding efficiency of the bonding head within a small searching area while avoiding impacts on the chip caused by the overshoot during high acceleration positioning of the bonding head.

3 Claims, 3 Drawing Sheets

(56) References Cited

FOREIGN PATENT DOCUMENTS

| | | |
|---|---|---|
| CN | 211219120 U | 8/2020 |
| CN | 112809158 A | 5/2021 |
| CN | 113241319 A | 8/2021 |
| CN | 113478132 A | 10/2021 |
| GB | 2051418 A | 1/1981 |

OTHER PUBLICATIONS

L. Zhang et al., "A VCM Active Actuation Method for Bonding Time Reduction in Chip Packaging Process," in IEEE Transactions on Industrial Electronics, vol. 68, No. 8, pp. 7252-7262, Aug. 2021. (Year: 2021).*

* cited by examiner the bonding head performs a high acceleration motion, while the vertical lifting mechanism of the micro-motion platform is positioned at the descent distance

the high acceleration motion of the bonding head ends, and overshoot occurs

after the overshoot ends the vertical lifting mechanism drives the chip upward, and the chip reaching the bonding site

bonding head moves at a constant speed to the bonding position to begin the bonding operation

FIG. 3

COOPERATIVE BONDING METHOD FOR A BONDING HEAD OF A WIRE BONDING MACHINE AND A WIRE BONDING MACHINE

CROSS REFERENCE TO RELATED APPLICATIONS

This application claims foreign priority of Chinese Patent Application No. 202311416198.7, filed on Oct. 30, 2023 in the China National Intellectual Property Administration, the disclosures of all of which are hereby incorporated by reference.

TECHNICAL FIELD

The present disclosure relates to the technical field of wire bonding machine, in particular to a cooperative bonding method for a bonding head and a wire bonding machine and a wire bonding machine.

BACKGROUND

Microelectronic devices and their chips feature fine spacing and high integration, which raises increasingly high demands for the efficiency and accuracy of packaging equipment. As a key core device in chip packaging equipment, wire bonding machines face challenges in speed, precision, and stability concerning bonding operation efficiency and quality. In wire bonding equipment, the bonding head mechanism typically needs to achieve high-precision positioning (within 3 micrometers) with the pads on the chip at ultra-high acceleration (greater than 100 g) within a very short time. Under such high-dynamic conditions, the bonding head experiences inertial impact and residual vibration upon arrival. To prevent this impact from damaging the chip, it is often necessary to add a searching area in the range of 80 to 150 micrometers above the pad to accommodate the bonding head's overshoot and residual vibrations. This allows the bonding head to mitigate its vibrations in this area after high acceleration motion and make contact with the pad of the chip at a low and uniform speed. Clearly, the introduction of the searching area can prevent the overshoot and vibration from the bonding head's high acceleration positioning away from impacting the chip. However, if the searching area is too large, it can reduce bonding efficiency, while the searching area that is too small may lead to overshoot impacts on the chip, thereby affecting chip quality. Therefore, how to improve the bonding efficiency of the bonding head while using a small searching area, based on preventing the overshoot from high acceleration positioning of the bonding head from impacting the chip, is a technical problem that practitioners in the field urgently need to solve.

SUMMARY

The present disclosure provides a cooperative bonding method for a bonding head of a wire bonding machine and a wire bonding machine, to improve the bonding efficiency of the bonding head with a small searching area, while avoiding the impact of overshoot from high acceleration positioning of the bonding head from impacting the chip.

In view of this, the present disclosure provides a cooperative bonding method for a bonding head of a wire bonding machine, including:

The present disclosure further provides a cooperative bonding method for a bonding head of a wire bonding machine, wherein, being applied to a wire bonding machine that includes a bonding head and a micro-motion stage, and the micro-motion stage includes a vertical lifting mechanism mounted on a base, with a loading platform provided at a top of the vertical lifting mechanism to support a target processing chip; and the cooperative bonding method for the bonding head of the wire bonding machine, including:

setting an initial height value of the vertical lifting mechanism to be a difference value between a height value of a chip bonding position and a distance from a pad to a surface of the loading platform;

upon receiving a bonding instruction, controlling the bonding head to perform an positioning operation on the target processing chip, during the positioning operation of the bonding head on the target processing chip, before the bonding head completes overshoot, controlling the vertical lifting mechanism to descend a preset distance, wherein the preset distance is defined as:

$$\mu \geq |He^{-\zeta w_n t_p} \sin(w_d t_p + \psi)| + (H_m + h - H);$$

wherein, $\mu$ is the preset distance for the descending of the vertical lifting mechanism; and $H$ is a travel distance for a high acceleration motion of the bonding head, with the high acceleration motion defined as a movement with acceleration greater than 100 g; and $\zeta$ is a damping ratio of the bonding head; and $w_n$ is a free vibration frequency of the bonding head; and $w_d$ is a damped vibration frequency of the bonding head; and $t_p$ is a time at which a maximum amplitude of the bonding head's overshoot occurs; and $H_m$ is a height of the loading platform before the vertical lifting mechanism descends; and $h$ is a distance from the pad to a surface of the loading platform; and $\psi$ is an initial phase angle of a vibration of the bonding head; and during the positioning operation of the bonding head on the target processing chip, when the bonding head has completed the high acceleration motion and the overshoot, controlling the vertical lifting mechanism to rise back to an initial height position; and during a process of the vertical lifting mechanism rises back to the initial height position, the pad of the chip does not exceed a residual vibration curve of the bonding head.

Furthermore, the vertical lifting mechanism is driven by a voice coil motor or a piezoelectric ceramic.

a trajectory function of a upward movement of the vertical lifting mechanism is:

$$\gamma(t) \leq H - He^{-\zeta w_n t} \sin(w_d t + \psi) - h;$$

wherein, $\gamma(t)$ is the trajectory function of the upward movement of the vertical lifting mechanism.

The present disclosure also provides a wire bonding machine, the wire bonding machine includes a bonding head and a micro-motion stage, and the micro-motion stage includes a vertical lifting mechanism mounted on a base, with a loading platform provided at a top of the vertical lifting mechanism to support a target processing chip; and a cooperative bonding method for a bonding head of a wire bonding machine is performed by the wire bonding machine.

The cooperative bonding method for the bonding head of the wire bonding machine provided by the present disclosure is applicable to a wire bonding machine that includes the bonding head and the micro-motion stage, and the micro-motion stage includes the vertical lifting mechanism mounted on the base, with the loading platform provided at the top of the vertical lifting mechanism to support the target processing chip. setting an initial height value of the vertical lifting mechanism to be a difference value between a height value of a chip bonding position and a distance from a pad to a surface of the loading platform; upon receiving a bonding instruction, controlling the bonding head to perform an positioning operation on the target processing chip, during the positioning operation of the bonding head on the target processing chip, before the bonding head completes overshoot, controlling the vertical lifting mechanism to descend a preset distance, wherein the preset distance is defined as:

$$\mu \geq |He^{-\zeta w_n t_p} \sin(w_d t_p + \psi)| + (H_m + h - H);$$

wherein, $\mu$ is the preset distance for the descending of the vertical lifting mechanism; and H is a travel distance for a high acceleration motion of the bonding head, with the high acceleration motion defined as a movement with acceleration greater than 100 g; and $\zeta$ is a damping ratio of the bonding head; and $w_n$ is a free vibration frequency of the bonding head; and $w_d$ is a damped vibration frequency of the bonding head; and $t_p$ is a time at which a maximum amplitude of the bonding head's overshoot occurs; and $H_m$ is a height of the loading platform before the vertical lifting mechanism descends; and h is a distance from the pad to a surface of the loading platform; and $\psi$ is an initial phase angle of a vibration of the bonding head; when the bonding head has completed the high acceleration motion and the overshoot, controlling the vertical lifting mechanism to rise back to a initial height position; and during a process of the vertical lifting mechanism rises back to the initial height position, the pad of the chip does not exceed a residual vibration curve of the bonding head.

The cooperative bonding method provided by the present disclosure avoids the impact of bonding head overshoot and residual vibration on the chip. It achieves enhanced bonding efficiency with a small searching area while ensuring bonding quality. This results in a technical effect of improving the bonding head's bonding efficiency with a reduced searching area, while avoiding the impact of high-acceleration positioning overshoot on the chip.

At the same time, this method addresses bonding quality issues caused by variations in chip pad heights by incorporating the distance h from the pad to the stage surface into the preset descending distance of the vertical lifting mechanism, further ensuring the quality of the chip bonding.

BRIEF DESCRIPTION OF THE DRAWINGS

To clarify the technical solutions of the embodiments of the present disclosure or prior arts, a brief introduction to the drawings introduced in the description of the embodiments or prior arts is provided below. It is evident that the drawings described below are merely some embodiments of the present disclosure. For those skilled in the art, other relevant drawings can be obtained from these drawings without requiring inventive effort.

FIG. 3 is a working principle logic diagram of the cooperative bonding method for the bonding head of the wire bonding machine.

DETAILED DESCRIPTION OF THE EMBODIMENTS

The technical solutions in the embodiments of the present disclosure will be described clearly and completely with reference to the accompanying drawings in the embodiments of the present disclosure. Obviously, the described embodiments are only a part of the embodiments of the present disclosure rather than all of them. Based on the embodiments in the present disclosure, all other embodiments obtained by those skilled in the art without creative work shall fall within the scope of protection of the present disclosure.

Figure 1:
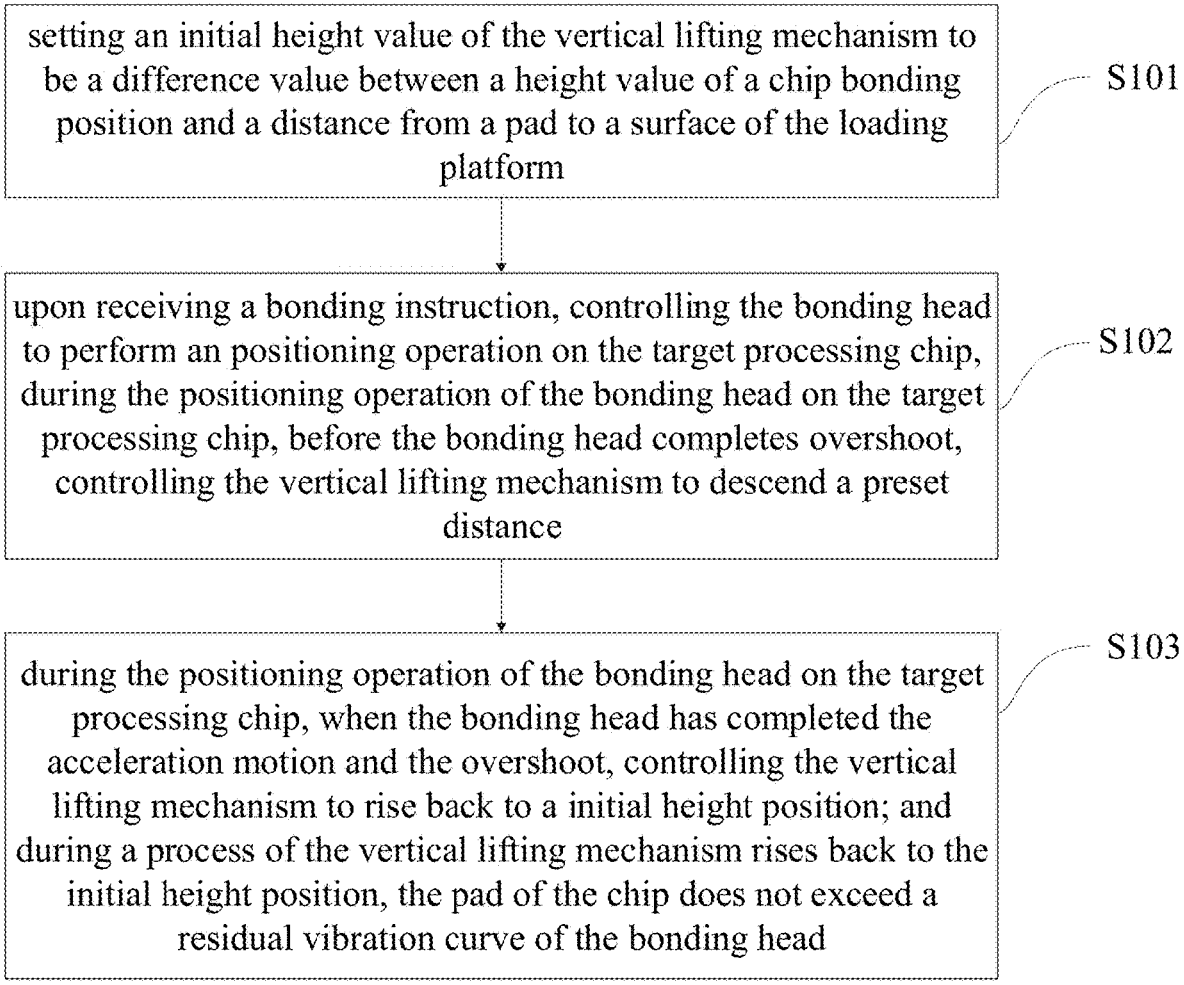
FIG. 1 is a flow chart of a cooperative bonding method for a bonding head of a wire bonding machine according to an embodiment of the present disclosure.
Figure 2:
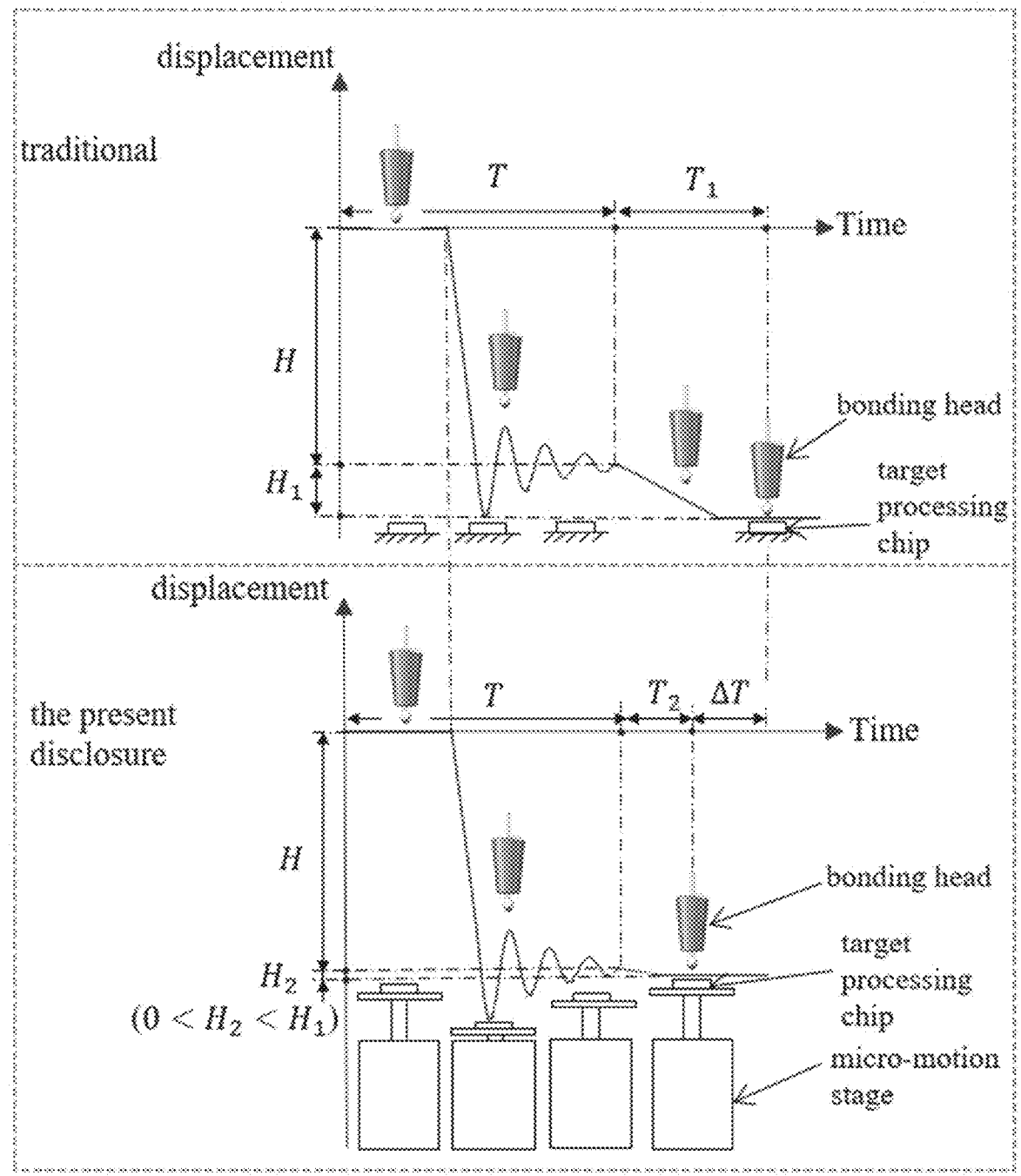
FIG. 2 is a comparison diagram between a wire bonding principle of the cooperative bonding method for the bonding head of the wire bonding machine provided by the present disclosure and a wire bonding principle of a traditional bonding head of a traditional wire bonding machine.

For ease of understanding, please refer to FIGS. 1 to 3, the present disclosure provides an embodiment of a cooperative bonding method for a bonding head of a wire bonding machine, the method is applied to a wire bonding machine that includes a bonding head and a micro-motion stage, and the micro-motion stage includes a vertical lifting mechanism mounted on a base, with a loading platform provided at a top of the vertical lifting mechanism to support a target processing chip, and the method includes the following steps:

S101, setting an initial height value of the vertical lifting mechanism to be a difference value between a height value of a chip bonding position and a distance from a pad to a surface of the loading platform;

S102, upon receiving a bonding instruction, controlling the bonding head to perform a positioning operation on the target processing chip, during the positioning operation of the bonding head on the target processing chip, before the bonding head completes overshoot, controlling the vertical lifting mechanism to descend a preset distance, wherein the preset distance is defined as:

$$\mu \geq |He^{-\zeta w_n t_p} \sin(w_d t_p + \psi)| + (H_m + h - H);$$

wherein, $\mu$ is the preset distance for the descending of the vertical lifting mechanism; and H is a travel distance for a high acceleration motion of the bonding head, with the high acceleration motion defined as a movement with acceleration greater than 100 g; and $\zeta$ is a damping ratio of the bonding head; and $w_n$ is a free vibration frequency of the bonding head; and $w_d$ is a damped vibration frequency of the bonding head; and $t_p$ is a time at which a maximum amplitude of the bonding head's overshoot occurs; and $H_m$ is a height of the loading platform before the vertical lifting mechanism descends; and h is a distance from the pad to a surface of the loading platform; and $\psi$ is an initial phase angle of a vibration of the bonding head.

S103, during the positioning operation of the bonding head on the target processing chip, when the bonding head has completed the high acceleration motion and the overshoot, controlling the vertical lifting mechanism to rise back to an initial height position; and during a process of the vertical lifting mechanism rises back to the initial height position, the pad of the chip does not exceed a residual vibration curve of the bonding head.

It should be noted that the wire bonding machine is the core equipment in the chip packaging process. During its bonding operation, the bonding head mechanism typically approaches the pad on the chip with ultra-high acceleration. This can lead to overshoot and residual vibration when the bonding head reaches its position, which may impact the chip and subsequently affect bonding quality. To avoid this impact and prevent damage to the chip during the bonding operation, a searching area is usually set above the pad to accommodate the overshoot of the bonding head. The bonding head enters the searching area with high acceleration and then transitions to a low-speed uniform motion to approach the pad. The inclusion of the searching area prevents direct impact on the chip and ensures bonding quality, but it also prolongs a positioning cycle of the bonding head, thereby affecting overall packaging efficiency.

As shown in FIG. 2, in the embodiment of the present disclosure, the micro-motion stage itself serves as a loading platform, which includes a vertical lifting mechanism. The top of the vertical lifting mechanism is equipped with a loading platform to support the target processing chip. The vertical lifting mechanism is driven by a voice coil motor or a piezoelectric ceramic, providing high-speed and high-precision response capabilities. This allows for timely and accurate responses based on the motion state of the high acceleration packaging equipment's bonding head and pad position information, thereby improving packaging accuracy and speed. Once the bonding head operates at high acceleration and reaches its position, it will generate overshoot and residual vibration. According to dynamics principles, the process of overshoot and residual vibration can be described as follows:

$$Y_1(t)=H-He^{-\zeta w_n t}\sin(w_d t+\psi);$$

wherein, $Y_1(t)$ is a function of the overshoot and residual vibration; and H is a travel distance for a high acceleration motion of the bonding head; and $\zeta$ is a damping ratio of the bonding head; and $w_n$ is a free vibration frequency of the bonding head; and $w_d$ is a damped vibration frequency of the bonding head; and t is a time variable; and $\psi$ is an initial phase angle of a vibration of the bonding head; and the initial phase angle $\psi$ of is related to the acceleration and damping ratio of the bonding head.

To avoid impact of the bonding head on the chip, the vertical lifting mechanism descends a preset distance before the bonding head completes its high-acceleration motion, with the preset distance being:

$$\mu \geq |He^{-\zeta w_n t_p}\sin(w_d t_p+\psi)|+(H_m+h-H);$$

wherein, $\mu$ is the preset distance for vertical lifting mechanism to descend; and H is the travel distance for the high acceleration motion of the bonding head; and $\zeta$ is the damping ratio of the bonding head; and $w_n$ is the free vibration frequency of the bonding head; and $w_d$ is the damped vibration frequency of the bonding head; and $t_p$ is the time at which a maximum amplitude of the bonding head's overshoot occurs; and $H_m$ is the height of the loading platform before the vertical lifting mechanism descends; and h is the distance from the pad to a surface of the loading platform; and $\psi$ is the initial phase angle of a vibration of the bonding head.

When the bonding head reaches its position during high acceleration motion, overshoot occurs. After the overshoot ends, the vertical lifting mechanism makes a high-speed upward movement to accurately reach the initial position, positioning the chip at the bonding site. Due to residual vibration still present after the overshoot, the vertical lifting mechanism must ensure that during its rapid ascent to the initial height position, the pad of chip does not exceed the residual vibration curve of the bonding head. This prevents the upward movement of the micro-motion stage from impacting the chip with vibrations from the bonding head. Therefore, the trajectory of the vertical lifting mechanism's high-speed upward movement from the end of the overshoot until the bonding head stabilizes is:

$$\gamma(t) \leq H-He^{-\zeta w_n t}\sin(w_d t+\psi)-h;$$

wherein, $\gamma(t)$ is the trajectory function of the upward movement of the vertical lifting mechanism.

After the bonding head stabilizes, the micro-motion stage performs a rapid and precise upward movement based on the current distance between the pad and the bonding position, allowing the chip to reach the bonding position. Subsequently, the bonding head moves at a constant speed to the bonding position to begin the bonding operation. At this point, due to the vertical movement of the micro-motion stage, the searching area of the bonding head is significantly reduced, greatly improving the efficiency of the bonding operation.

In FIG. 2, $H_1$ is a searching area for the traditional bonding head mechanism, and $H_2$ is the searching area for the bonding head of the wire bonding machine provided by the present disclosure, and T represents the time of high-acceleration motion of the bonding head, $T_1$ is the time for the bonding head's constant-speed motion in the traditional bonding head mechanism is indicated, and $T_2$ is the constant-speed motion time of the bonding head of the wire bonding machine provided by the present disclosure. From FIG. 2, it can be seen that in the wire bonding machine provided by the present disclosure, the searching area of the bonding head has been reduced compared to the original working process, with the bonding head's constant-speed motion time decreased to $\Delta T (\Delta T=T_1-T_2)$, and the efficiency of bonding operation has been improved by $$\frac{\Delta T}{T+T_1}.$$

It should be noted that in the wire bonding machine provided by the present disclosure, the bonding head only transitions to constant-speed motion after achieving high acceleration positioning and stabilizing. In practice, the bonding head can also directly switch to constant speed motion after reaching high acceleration. The wire bonding machine provided by the present disclosure remains applicable in this scenario. That is, after the bonding head reaches high acceleration, it transitions to constant-speed motion to the bonding position, at which point overshoot occurs. Meanwhile, the micro-motion stage carrying the chip avoids the overshoot, allowing the chip to ascend to the bonding position and thereby reducing the searching area of the bonding head.

Additionally, since the overshoot of the bonding head is related to its acceleration, the proposed method allows the bonding head's overshoot to not impact the carrying chip due to the downward action of the micro-motion stage. This enables the bonding head to operate at a higher acceleration without causing shock to the carrying chip, which also enhances the positioning efficiency of the bonding head.

For the wire-bonding machine provided by the present disclosure, on one hand, the micro-motion stage can initially be positioned at a safe location that is not affected by the bonding head's overshoot. After the overshoot ends, it can perform an upward movement to reduce the bonding head's searching area, eliminating the need for downward movement during the overshoot. This safe position corresponds to a preset distance for the vertical lifting mechanism's descent, with the preset distance being:

$$\mu \geq |He^{-\zeta w_n t_p}\sin(w_d t_p+\psi)|+(H_m+h-H);$$

wherein, μ is the preset distance for the descending of the vertical lifting mechanism; and H is a travel distance for a high acceleration motion of the bonding head, with the high acceleration motion defined as a movement with acceleration greater than 100 g; and ζ is a damping ratio of the bonding head; and $w_n$ is a free vibration frequency of the bonding head; and $w_d$ is a damped vibration frequency of the bonding head; and $t_p$ is a time at which a maximum amplitude of the bonding head's overshoot occurs; and $H_m$ is a height of the loading platform before the vertical lifting mechanism descends; and h is a distance from the pad to a surface of the loading platform; and ψ is an initial phase angle of a vibration of the bonding head.

On the other hand, a distance threshold can be set between the pad and the bonding head. During the high acceleration movement of the bonding head, when the distance between the pad and the bonding head is less than the distance threshold, the micro-motion platform descends to move the chip away from the overshoot of the bonding head, and the preset distance satisfies the following function:

$$\mu \geq |He^{-\zeta w_n t_p} \sin(w_d t_p + \psi)| + (H_m + h - H);$$

wherein, μ is the preset distance for the descending of the vertical lifting mechanism; and H is the travel distance for a high acceleration motion of the bonding head; and ζ is the damping ratio of the bonding head; and $w_n$ is the free vibration frequency of the bonding head; and $w_d$ is the damped vibration frequency of the bonding head; and $t_p$ is the time at which a maximum amplitude of the bonding head's overshoot occurs; and $H_m$ is the height of the loading platform before the vertical lifting mechanism descends; and h is the distance from the pad to the surface of the loading platform; and ψ is the initial phase angle of a vibration of the bonding head. Once the bonding head completes the high acceleration movement and the overshoot, the micro-motion platform moves upwards at high speed, quickly and accurately positioning the chip to the bonding position.

The cooperative bonding method for the bonding head of the wire bonding machine provided by the present disclosure is applicable to a wire bonding machine that includes the bonding head and the micro-motion stage, and the micro-motion stage includes the vertical lifting mechanism mounted on the base, with the loading platform provided at the top of the vertical lifting mechanism to support the target processing chip. setting an initial height value of the vertical lifting mechanism to be a difference value between a height value of a chip bonding position and a distance from a pad to a surface of the loading platform; upon receiving a bonding instruction, controlling the bonding head to perform an positioning operation on the target processing chip, during the positioning operation of the bonding head on the target processing chip, before the bonding head completes overshoot, controlling the vertical lifting mechanism to descend a preset distance, wherein the preset distance is defined as:

$$\mu \geq |He^{-\zeta w_n t_p} \sin(w_d t_p + \psi)| + (H_m + h - H);$$

wherein, μ is the preset distance for the descending of the vertical lifting mechanism; and H is a travel distance for a high acceleration motion of the bonding head, with the high acceleration motion defined as a movement with acceleration greater than 100 g; and ζ is a damping ratio of the bonding head; and $w_n$ is a free vibration frequency of the bonding head; and $w_d$ is a damped vibration frequency of the bonding head; and $t_p$ is a time at which a maximum amplitude of the bonding head's overshoot occurs; and $H_m$ is a height of the loading platform before the vertical lifting mechanism descends; and h is a distance from the pad to a surface of the loading platform; and ψ is an initial phase angle of a vibration of the bonding head; when the bonding head has completed the high acceleration motion and the overshoot, controlling the vertical lifting mechanism to rise back to a initial height position; and during a process of the vertical lifting mechanism rises back to the initial height position, the pad of the chip does not exceed a residual vibration curve of the bonding head.

The cooperative bonding method provided by the present disclosure avoids the impact of bonding head overshoot and residual vibration on the chip. It achieves enhanced bonding efficiency with a small searching area while ensuring bonding quality. This results in a technical effect of improving the bonding head's bonding efficiency with a reduced searching area, while avoiding the impact of high-acceleration positioning overshoot on the chip.

At the same time, this method addresses bonding quality issues caused by variations in chip pad heights by incorporating the distance h from the pad to the stage surface into the preset descending distance of the vertical lifting mechanism, further ensuring the quality of the chip bonding.

An embodiment of the wire bonding machine is also provided, which is designed to execute the cooperative bonding method described above. This wire bonding machine includes a bonding head and a micro-motion platform, where the micro-motion platform consists of a vertical lifting mechanism mounted on a base, and a loading platform at the top for supporting the target processing chip.

The wire bonding machine described in this disclosure is designed to implement the wire bonding method provided herein, and its principles and technical effects are consistent with those of the method. Therefore, no further details are necessary.

The above-described embodiments are merely intended to illustrate the technical solutions of the present invention and are not intended to limit them. Although the present invention has been described in detail with reference to the aforementioned embodiments, those of ordinary skill in the art should understand that modifications can still be made to the technical solutions described in those embodiments, or some technical features may be equivalently replaced. Such modifications or replacements do not depart from the spirit and scope of the technical solutions of the present invention.

What is claimed is:

1. A cooperative bonding method for a bonding head of a wire bonding machine, wherein, being applied to a wire bonding machine that comprises a bonding head and a micro-motion stage, and the micro-motion stage comprises a vertical lifting mechanism mounted on a base, with a loading platform provided at a top of the vertical lifting mechanism to support a target processing chip; and wherein, the cooperative bonding method for the bonding head of the wire bonding machine, comprising:

setting an initial height value of the vertical lifting mechanism to be a difference value between a height value of a chip bonding position and a distance from a pad to a surface of the loading platform; and upon receiving a bonding instruction, controlling the bonding head to perform a positioning operation on the target processing chip, during the positioning operation of the bonding head on the target processing chip, before the bonding head completes overshoot, controlling the vertical lifting mechanism to descend a preset distance, wherein the preset distance is defined as:

$$\mu \geq |He^{-\zeta w_n t_p}\sin(w_d t_p+\psi)|+(H_m+h-H);$$

wherein, $\mu$ is the preset distance for the descending of the vertical lifting mechanism; and H is a travel distance for an acceleration motion of the bonding head, with the acceleration motion defined as a movement with acceleration greater than 100 g; and $\zeta$ is a damping ratio of the bonding head; and $w_n$ is a free vibration frequency of the bonding head; and $w_d$ is a damped vibration frequency of the bonding head; and $t_p$ is a time at which a maximum amplitude of the bonding head's overshoot occurs; and $H_m$ is a height of the loading platform before the vertical lifting mechanism descends; and h is a distance from the pad to a surface of the loading platform; and $\psi$ is an initial phase angle of a vibration of the bonding head; and during the positioning operation of the bonding head on the target processing chip, when the bonding head has completed the acceleration motion and the overshoot, controlling the vertical lifting mechanism to rise back to a initial height position; and during a process of the vertical lifting mechanism rises back to the initial height position, the pad of the chip does not exceed a residual vibration curve of the bonding head.

2. The cooperative bonding method for the bonding head of the wire bonding machine according to claim 1, wherein, the vertical lifting mechanism is driven by a voice coil motor or a piezoelectric ceramic.

3. The cooperative bonding method for the bonding head of the wire bonding machine according to claim 1, wherein, a trajectory function of a upward movement of the vertical lifting mechanism is:

$$\gamma(t)\leq H-He^{-\zeta w_n t}\sin(w_d t+\psi)-h;$$

wherein, $\gamma(t)$ is the trajectory function of the upward movement of the vertical lifting mechanism, t is a time variable.

* * * * *